US010094536B1

(12) United States Patent
Rousseau et al.

(10) Patent No.: US 10,094,536 B1
(45) Date of Patent: Oct. 9, 2018

(54) COMPACT HIGH-SPECTRAL-RADIANCE FLUORESCENT LIGHT SOURCE INCLUDING A PARABOLIC MIRROR

(71) Applicant: Optomak, Inc., Quebec (CA)

(72) Inventors: Guy Rousseau, L'Ancienne-Lorette (CA); Sead Doric, L'Ancienne-Lorette (CA)

(73) Assignee: OPTOMAK, INC. (CA)

( * ) Notice: Subject to any disclaimer, the term of this patent is extended or adjusted under 35 U.S.C. 154(b) by 0 days.

(21) Appl. No.: 15/459,056

(22) Filed: Mar. 15, 2017

(51) Int. Cl.
*F21V 7/00* (2006.01)
*F21V 7/06* (2006.01)
*F21V 29/76* (2015.01)
*F21V 5/04* (2006.01)
*H01S 5/40* (2006.01)
*F21V 9/08* (2018.01)
*F21K 9/64* (2016.01)
*H01S 5/024* (2006.01)
*F21Y 115/30* (2016.01)

(52) U.S. Cl.
CPC ............... *F21V 7/06* (2013.01); *F21K 9/64* (2016.08); *F21V 5/04* (2013.01); *F21V 9/08* (2013.01); *F21V 29/76* (2015.01); *H01S 5/02415* (2013.01); *H01S 5/02484* (2013.01); *H01S 5/40* (2013.01); *F21Y 2115/30* (2016.08)

(58) Field of Classification Search
CPC ..... F21K 9/62; F21K 9/64; F21V 5/04; F21V 7/06; F21V 9/08; F21V 29/76; F21Y 2115/30; H01S 5/02415; H01S 5/02484; H01S 5/40
USPC ...... 362/227–249.04, 272, 311.02, 326–327, 362/346, 554, 800
See application file for complete search history.

(56) References Cited

U.S. PATENT DOCUMENTS

| | | |
|---|---|---|
| 6,834,064 B1 | 12/2004 | Paschotta et al. |
| 7,898,665 B2 | 3/2011 | Brukilacchio et al. |
| 8,625,097 B2 | 1/2014 | Brukilacchio et al. |
| 8,929,413 B2 | 1/2015 | Aubry et al. |
| 2009/0059359 A1 | 3/2009 | Nahm et al. |
| 2012/0106178 A1 | 5/2012 | Takahashi et al. |

(Continued)

OTHER PUBLICATIONS

Denault, et al., "Efficient and stable laser-driven white lighting", AIP Advances 3, 072107, Jul. 2013, 7 pages (pp. 1-7 in pdf), AIP Publishing, NY, US.

(Continued)

*Primary Examiner* — Jason Moon Han
(74) *Attorney, Agent, or Firm* — Mitch Harris, Atty at Law, LLC; Andrew M. Harris

(57) ABSTRACT

A pumped fluorescent light source includes a parabolic mirror that is positioned to focus pumping light from one or more pump sources on a fluorescent body. The resulting assembly provides for heat collection from a back surface of the light source for both the fluorescent body and the pumping sources in a compact package that may be hermetically sealed. The parabolic mirror has reflective surfaces disposed outside of a collection area of an output beam of the light sources, so that the collection area is not obstructed by the parabolic mirror. The light source also includes a collecting lens for collecting the light emitted by the body. The parabolic mirror focuses the stimulus light on the fluorescent body to stimulate emission. An additional parabolic mirror may be included behind the fluorescent body to focus the fluorescent emissions that do not directly enter the collection area at a point of collection.

19 Claims, 7 Drawing Sheets

(56) References Cited

U.S. PATENT DOCUMENTS

| | | |
|---|---|---|
| 2013/0058114 A1 | 3/2013 | Reiners |
| 2016/0131334 A1 | 5/2016 | Rousseau et al. |
| 2018/0115137 A1 | 4/2018 | Sorg |

OTHER PUBLICATIONS

"Product Sheet: EQ-99XFC LDLS Compact, Long-Life, High-Brightness, Broadband Laser-Driven Light Source with Fiber-Coupled Output", Energetiq Technology, Inc., downloaded from: http://www.energetiq.com/fiber-coupled-laser-driven-light-source-long-life-compact.php on Nov. 11, 2014, 2 pages (pp. 1-2 in pdf).

Liu, et al., "Spatially coherent white-light interferometer based on a point fluorescent source", Optics Letters, May 1993, pp. 678-680, vol. 18, No. 9, Optical Society of America, US.

"OSL2 High-Intensity Fiber Light Source: User Guide", Thorlabs, CTN002086-D02, Rev A, Jan. 15, 2014, 12 pages (pp. 1-12 in pdf), Thorlabs, Inc., Newton, NJ, US.

Tsai, et al., "Ce3+: YAG double-clad crystal-fiber-based optical coherence tomography on fish cornea", Optics Letters, Mar. 2010, pp. 811-813, vol. 35, No. 6, Optical Society of America, US.

Tuite, Don, "Blend Blue LEDS and Phosphors to Make HB LEDs", Electronic Design, May 2013, pp. 42-44, Penton Electronics Group, US.

Vatnik, et al., "Efficient thin-disk Tm-laser operation based on Tm:KLu(WO4)2/KLu(WO4)2 epitaxies", Optics Letters, Feb. 2012, pp. 356-358, vol. 37, No. 3, Optical Society of America, US.

"Product Sheet: WLS1000 Fibre-coupled White Light Source", Bentham Instruments Ltd., downloaded from: http://www.bentham.co.uk/wls100.htm on Oct. 1, 2014, 2 pages (pp. 1-2 in pdf).

"Advertisement: Broadband Fiber-Coupled Light Sources", Edmund Optics Inc., downloaded from http://www.edmundoptics.com/testing-targets/spectrometers/broadband-fiber-coupled-light-sources/3575 on Oct. 1, 2014.

Office Action in U.S. Appl. No. 14/538,026 dated Aug. 15, 2017, 12 pages (pp. 1-12 in pdf).

COMPACT HIGH-SPECTRAL-RADIANCE FLUORESCENT LIGHT SOURCE INCLUDING A PARABOLIC MIRROR

BACKGROUND OF THE INVENTION

1. Field of the Invention

The present invention is related generally to optical sources, and in particular to a high-radiance fluorescent light source including a parabolic mirror directing stimulus light to a fluorescent body.

2. Background of the Invention

In biomedical applications, as well as other applications requiring stimulation of fluorescence or other similar illumination requirements, a broadband optical source is typically needed, as the speckle field generated by narrowband illumination makes narrowband illumination unsuitable for many biomedical and imaging applications, such as optogenetics applications. Historical broadband incoherent light sources require relatively large optical systems and reflectors to concentrate light in a narrow beam in order to provide an efficient source of illumination, and to provide high intensity when coupling into a waveguide such as an optical fiber.

Present-day solid state broadband fluorescent light sources, such as the so-called "white LEDs" (light-emitting diodes), frequently employ LEDs to pump (optically stimulate) fluorescent materials such as fluorescent crystal powder embedded in epoxy resin or individual fluorescent crystals. While the use of LEDs as pumps reduces cost and size, the spectral radiance (W/Hz/m$^2$/sr) of these fluorescent light sources is limited by the radiance (W/m$^2$/sr) of the pump LED(s) within the absorption band of the fluorescent material, and thermal management of the heat transferred to the fluorescent material from the stimulus. The use of low radiance optical pump sources such as LEDs leads to fluorescent light emission of low spectral radiance. Such low spectral radiance sources either provide poorly collimated light beams which are not suitable for long-range applications or poorly focused light beams which are not suitable for high-resolution applications and, in particular, for coupling in light guides such as liquid light guides and sub-mm core optical fibers.

In order to cool a fluorescent body in higher-radiance applications, front-surface or front-end pumping schemes may be employed. In such geometries, the output fluorescent light beam is on the same side as the input pump beams. These front-side pumping schemes often require pumping light sources (laser diodes, LEDs or other) as well as beam steering and focusing optics of these pump sources to be positioned on the front of the fluorescent material. Such an arrangement has several disadvantages. First, there are practical space limitations in positioning optical elements in front of the fluorescent body. The light-collecting optics of the output fluorescent light beam and further optical components such as: bandpass filters, beam combiners, fiber-coupling optics, etc. must then be located in front of the fluorescent body. Second, when the pump sources are located in front of the fluorescent body, the heat management of the device is complicated by the fact that each pump source generates its own heat load in addition to the pumped fluorescent material. The resulting arrangement requires the use of multiple heat sinks remotely located from each other, thus complicating the thermal interface of the resulting light source with a passive or active cooling system. Finally, the resulting light source requires assembly procedures that raise difficulties in high-volume manufacturing and optical alignment.

Therefore, it would be desirable to provide a light source with high spectral radiance, while maintaining a compact design and low manufacturing cost.

SUMMARY OF THE INVENTION

The above objectives of providing a low manufacturing cost and compact light source having high spectral radiance is provided in a light source and a method of operation of the light source.

The light source includes a body having a material doped to have a fluorescent property when stimulated at a stimulus wavelength, a collecting lens for collecting the light emitted by the body, a parabolic mirror, and one or more light sources for providing stimulus light at the stimulus wavelength. The light sources have outputs directed at the parabolic mirror, so that the parabolic mirror focuses the stimulus light provided by the one or more light sources at the body to stimulate emission of the light emitted by the body. The parabolic mirror is positioned to have a focal axis directed at the body and having reflective surfaces disposed outside of a collection area of the output beam so that the collection area is not obstructed by the parabolic mirror.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATED EMBODIMENT

The present disclosure reveals light sources that provide high spectral radiance in a compact package that has improved manufacturability due to reduced component count. By including multiple pump light sources for stimulating a fluorescent body to emit a fluorescent light beam and gathering the pumping light with a parabolic mirror surface disposed outside of the output fluorescent light beam, the amount of light produced by the light source is increased, while providing better thermal management by locating the pump light sources behind the output of the light source. The parabolic mirror may be circular in profile, or the profile may be annular, in order to provide an aperture for extracting the emitted output beam. The pump light sources can be coupled to the same thermal sink as the fluorescent body. The light source provides a systematic and simplified alignment procedure as well. By removing obstructions that would otherwise be located in front of the fluorescent body, a large collection solid angle is supported by a collector that forms the light source output beam. The configuration of the light sources illustrated herein also provides safer operation in case of failure since the direction of the pump beams are outside the solid angle of the output beam collecting optics. The optical alignment process of the illustrated light source also has reduced complexity that is suitable for automated optical alignment and assembly systems and therefore is suitable for high volume manufacturing. The resulting configuration provides efficient light collection of the output fluorescent light beam over a large solid angle, a compact packaging of pump light sources, fluorescent material and output light collecting optics, and a compact and simplified thermal management through a single planar hot surface located on the back of the light source opposite the output fluorescent light beam. The number of optical elements may also be reduced and the device geometry is compatible with compact hermetic packages similar to butterfly hermetic packages used in the telecommunication industry and, in particular, to high heat load (HHL) hermetic packages mostly used for high power laser diodes and quantum cascade lasers.

Figure 1A:
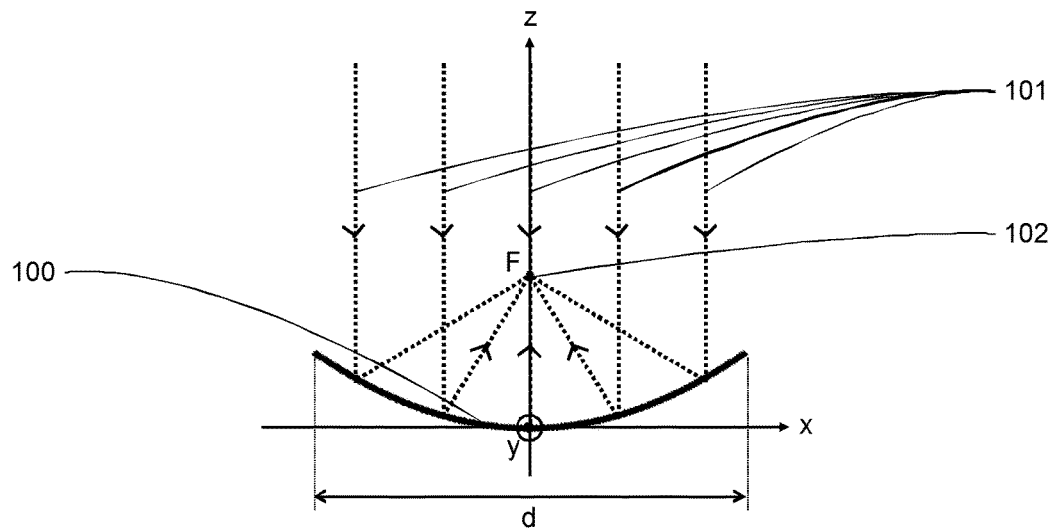
FIG. 1A and FIG. 1B are side cross-section views of an axisymmetric parabolic mirror as employed in various embodiments of the disclosure.
Figure 1B:
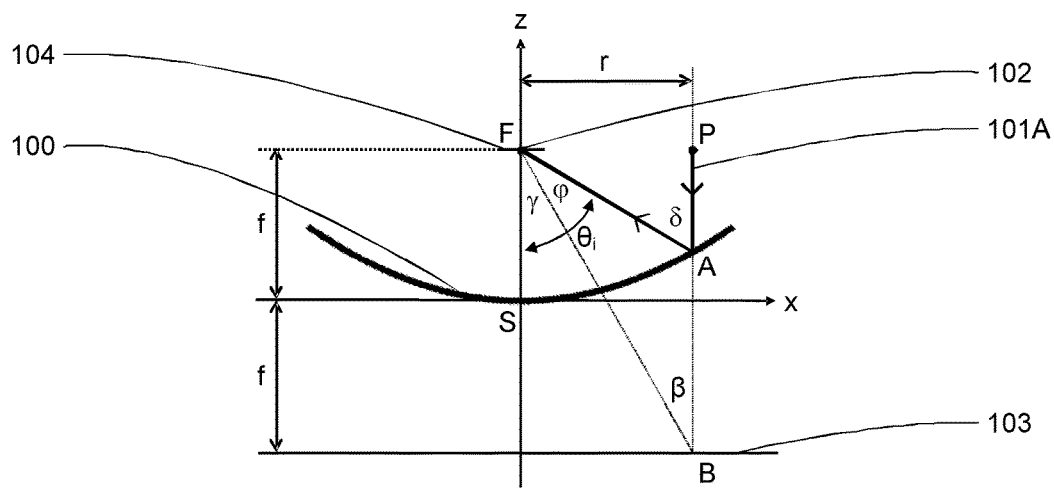

For the purpose of illustrating the operation of the various embodiments of light sources disclosed herein, an illustration of basic properties of parabolic mirrors is provided with reference to FIG. 1A and FIG. 1B. FIG. 1A shows a cross-section of an axisymmetric parabolic mirror having a reflective surface 100 described by the equation $z(x, y) = (x^2+y^2)/(4f)$ for any (x, y) such that $(x^2+y^2) \leq (d^2/4)$ where z is the position of the reflecting surface of the mirror, x and y are lateral positions expressed in Cartesian coordinates, d is the outer diameter of the parabolic mirror and parameter f is the focal length. Such a mirror reflects a collimated light beam parallel to the z axis or, equivalently, a bundle of incident light rays 101 arriving parallel to the z axis, at a focal point F 102 of the mirror located at coordinates (x, y, z)=(0, 0, f). A parabolic mirror has two well-known advantages. First, there is no spherical aberration leading to a blurring of the focal spot even for a high numerical aperture (NA), that is, even for a large ratio d/f of the mirror diameter d over the focal length f. Second, like any purely reflective optical component, there is no chromatic aberration, which means that the properties of the mirror, and more specifically the focal length f, are independent of the wavelength within the reflectivity bandwidth of reflective surface 100. Consequently, the position of focal point F 102 is independent of the wavelength, which leads to a tight focus even for broadband light beams such as fluorescent light beams. The absence of chromatic aberrations also implies that a single parabolic mirror can be used for both the focusing of the pump light beams and the collimation of the broadband fluorescent light beam. The primary disadvantage associated with parabolic mirrors is difficulty of manufacture, due to a need for surface accuracy and quality (i.e., low surface roughness), since sub-micron accuracy is required to provide an adequate parabolic reflector in the visible spectrum, e.g., for wavelengths in the range of 400-700 nm. However, optical surface shaping technologies are now becoming more accessible and affordable, among which: computer numerical control (CNC) grinding and polishing, diamond turning, glass or plastic molding, and magneto-rheological surface finishing (MRF), which can be used to fabricate parabolic mirrors as employed in the embodiments of the light sources disclosed below.

Referring now to FIG. 1B, the principles of operation of a parabolic mirror as employed in the embodiments disclosed herein are further illustrated. An optical path of a light ray 101A originates from a pump source located at point P and is reflected by reflective surface 100 at point A. Light ray 101A is initially parallel to the z axis and located at coordinate x=r in a plane defined by coordinate y=0. A line located at coordinate z=−f is a directrix 103 of the parabola. It is known that a parabola is the locus of all points equidistant from focal point F 102 and directrix 103. Consequently, the lengths of segment AB extending between point A and point B, and segment AF extending between point A and focal point F 102 are equal. Triangle ABF is thus an isosceles triangle, with equal angles φ and β. Since segment AP extending between point A and point P is parallel to the z-axis, segment PB extending between point P and point B is also parallel to the axis z, requiring that that angles γ and β be equal as alternate internal angles. Therefore angle $\delta = \angle SFA = \gamma + \varphi$ as alternate internal angles. Consequently, $\gamma = \varphi = \beta$ and $\delta = 2\beta$. The angle of incidence $\theta_i$ of light ray 101A, e.g., a pump light ray, on a front surface 104 of a body having a fluorescent property that placed at plane z=f is angle ∠SFA where point S is the summit of a parabola located at the origin (x, y, z)=(0, 0, 0) and A is the point of reflection of light ray 101A by reflective surface 100. By direct identification, angle $\theta_i = \angle SFA = \gamma + \varphi = 2\beta$ and thus $r = 2f \times \tan(\beta)$ and $r = 2f \times \tan(\theta_i/2)$. Equation $r = 2f \times \tan(\theta_i/2)$ linking r, f and $\theta_i$ is the basic design equation of parabolic mirrors used in the embodiments disclosed herein. The illustrated example is applicable to any pump source located at a distance r from the z-axis, since the illustrated parabolic mirror is axisymmetric. While the examples herein use axisymmetric parabolic mirrors to direct light from the pump sources to a fluorescent body, i.e., a material body having a fluorescent property, axisymmetric parabolic mirrors are not required, and other parabolic mirrors, such as a parabolic cylindrical mirror having a parabolic focus along a single axis, may be used in alternate embodiments.

In the embodiments described below, multiple high-power laser pump beams are focused on the front surface of a body including a fluorescent material. In such arrangements, the pump power density can reach very high values leading to significant local heating of the body containing the fluorescent material. Such local heating is not necessarily compatible even with the best commercially available anti-reflective (AR) coatings. For the above reason, an angle of incidence $\theta_i$ equal to the Brewster angle $\theta_B = \tan^{-1}(n)$, where n is the refractive index of the fluorescent material, provides an advantage. For $\theta_i = \theta_B$, the Fresnel reflection at the front air-body interface is eliminated for p-polarized light beams (i.e., beams of light having their electric field parallel to the incidence plane). Since a laser diode output beam is generally TE-polarized with a polarization ratio on the order of 100:1, the Fresnel reflection of all pump beams can be essentially eliminated without employing an AR coating by orienting the junction plane of each pump laser diode along a radial axis, e.g., a junction oriented parallel to the x-axis for a pump laser diode located at point P as shown in FIG. 1B. As an example a Ce:YAG single crystal has a refractive index n=1.85 at a pump wavelength of 450 nm. Consequently, $\theta_B=\tan^{-1}(n)=61.6°$ and the relationship between the radial position r of the pump source and the focal length f of the parabolic mirror becomes $r_B=2f\times\tan(\theta_B/2)=1.19\times f$. In order to achieve a compact design, the value of $r_B$ can be set, for example, to 10 mm. The focal length of the parabolic mirror is then given by $f=r_B/1.19=8.39$ mm. Such a design is also compatible with fluorescent light collection over a very large NA, through an aperture provided through the center of the parabolic mirror. As a first approximation, the parabolic mirror center aperture diameter can approach $2r_B$, providing a numerical aperture that approaches $NA=\sin(\theta_B)=0.871$. The above example illustrates an embodiment of the disclosure that is compatible with a Brewster angle front side pumping scheme while allowing collection of an emitted fluorescent light beam over a very large NA without obstructing the pump laser beams, although the example does not limit the possibilities of other arrangements that include the principles revealed by the disclosure, as recited in the Claims and equivalents thereof. Further, embodiments of the disclosure are not limited to Brewster angle pumping, and the pumping beams may be provided at a non-Brewster angle.

Figure 2A:
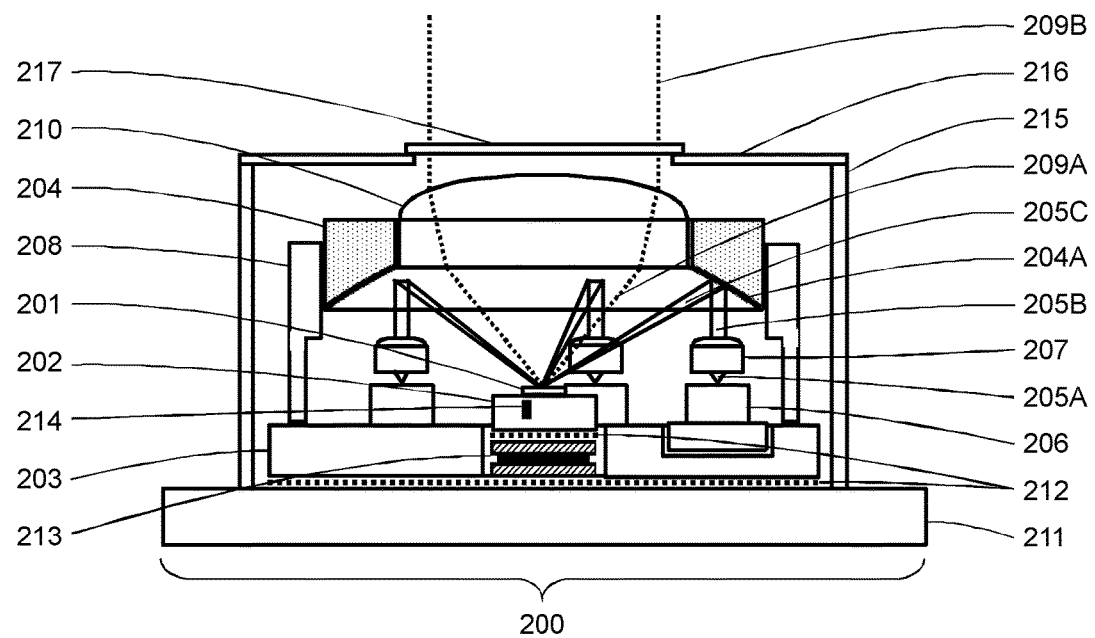
FIG. 2A is a side cross-section view and FIG. 2B is a partial top view of a light source according to an embodiment of the disclosure.

Referring now to FIG. 2A, a side cross-section view of a light source 200 according to a first embodiment is shown. The illustrated example provides optical pumping of a fluorescent body 201 provided by a thin layer of fluorescent material thermally and mechanically bonded to a heat spreader 202 positioned at a center of a pump laser diode mount 203. Heat spreader 202 and laser diode mount 203 are preferably made of a high thermal conductivity material such as copper, aluminum or a tungsten-copper (W—Cu) alloy. Heat spreader 202 can alternatively be formed as a stack of multiple materials to improve thermal management near a hot spot (the optically pumped area) in fluorescent body 201. Optical pumping is achieved via an annular parabolic mirror 204 that combines and focuses multiple pump beams provided by multiple pump laser diodes 206. Diverging pump beams 205A exiting from pump laser diodes 206, which in the example are provided in TO-can packages, are firstly collimated or nearly collimated using lenses 207 having an appropriate shape and focal length (e.g., high-NA aspherical molded glass lenses), a combination of fast-axis and slow-axis collimating lenses, or any single or multiple-element beam shaper suitable for providing substantially collimated beams. The resulting collimated or nearly collimated pump beams 205B are then redirected and focused on fluorescent body 201 after reflection from a high-reflectivity coating 204A of annular parabolic mirror 204. Annular parabolic mirror 204 is secured by a mirror mount 208 over pump laser diodes 206 and lenses 207 and positioned such that the focal point of annular parabolic mirror 204 is located at the center of fluorescent body 201. Each of the beams provided by laser diodes 206 and lenses 207 are steered and focused so that pump beams 205C are combined on the center of fluorescent body 201.

The illustrated light source 200 includes multiple pump laser diodes 206 distributed around the axis of symmetry of the system, however, asymmetric arrangements as well as arrangements all disposed to one side of fluorescent body 201 are also possible, with changes to annular parabolic mirror 204, which in some embodiments, do not require an aperture through annular parabolic mirror 204. All of the pump beams 205C, only three of which are illustrated in FIG. 2A as examples, are at least partially absorbed by the fluorescent body 201 which, in response to the stimulus provided by pump beams 205A-205C, emits fluorescent output upon de-excitation of the doping element after an average fluorescence life time, e.g., approximately 70 ns for a Ce:YAG crystal used as fluorescent body 201. The fluorescence is generally emitted isotropically, that is, over a solid angle of $4\pi$ steradians. It is thus advantageous to provide a broadband high-reflectivity coating at the back surface of fluorescent body 201 to reflect the fluorescent emissions that would otherwise not contribute to an output beam 209A. Output beam 209A, which is diverging as it passes through the aperture through annular parabolic mirror 204, is generally subjected to further spatial or spectral beam shaping by additional optical elements or devices. In the example, the central aperture provided through annular parabolic mirror 204 is filled by a large-NA collimating lens 210 designed to place the back focal point of collimating lens 210 at the pumped location of fluorescent body 201 to collect the fluorescent emission. A collimated output beam 209B is produced by collimating lens 210 to provide the output of the light source. The large-NA collimating lens 210 is preferably aspherical and achromatic to minimize the impact of spherical and chromatic aberrations on residual divergence of the collimated output beam 209B. Alternatively, in each of the embodiments depicted herein, the collimating device, e.g., collimating lens 210 may be provided by an on-axis or off-axis parabolic mirror, a Fresnel lens, or any other refracting, reflecting or diffractive optical device. While collimating lens 210 is located within the large aperture within annular parabolic mirror 204 in order to reduce package size, such co-location is not a requirement and a collimating device may be positioned above or underneath annular parabolic mirror 204 to collect and collimate the light that exits through the large aperture provided through annular parabolic mirror 204, as long as the focal point of the collimating device is coincident with the pumped location of fluorescent body 201.

Figure 2B:
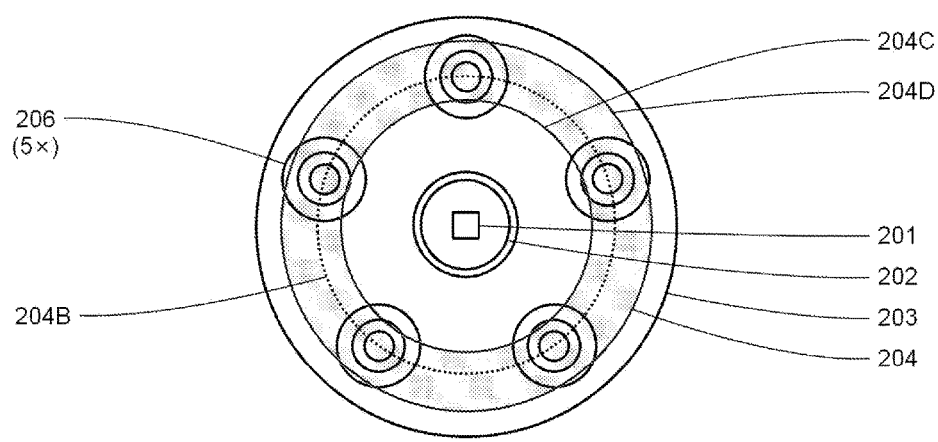

FIG. 2B is a simplified top view of light source 200 of FIG. 2A, in which the position of five pump laser diodes 206 arranged in a circle around fluorescent body 201 can be seen. An inner edge 204C of the large aperture through annular parabolic mirror 204 is shown, along with an outer edge 204D of annular parabolic mirror 204. In a particular embodiment employing Brewster angle laser diode pumping, the junctions of each of pump laser diodes 206 are arranged so that they are perpendicular to a guiding circle 204B to obtain the required p-polarized beams at the surface of fluorescent body 201. As mentioned above, it is advantageous to put a high-reflectivity (HR) broadband coating on the back surface of fluorescent body 201 to reflect the emitted fluorescence light towards the optical output, i.e., toward collecting and collimating lens 210. It is also preferable to extend the bandwidth of the HR coating to the pump wavelength in order to double the optical path length (OPL) of each pump beam inside the fluorescent material. The inner edge 204C of the large aperture generally has a diameter of greater than 80% of the diameter of guiding circle 204B in order to maximize the collecting area, i.e., the diameter of collimating lens 210. For example, the diameter of inner edge 204C may be 90% of the diameter of guiding circle 204B. The doubling of the optical path length of the pump beam allows using a fluorescent material of lower absorption coefficient $\mu_\alpha$ or, for a given value of $\mu_\alpha$, to use a thinner fluorescent material, thus improving the heat load removal from fluorescent body 201 by reduction of the thickness. For instance, Ce:YAG crystal plates with absorption coefficient $\mu_\alpha=60.0$ cm$^{-1}$ are commercially available. For Brewster angle pumping, the single-pass optical path length OPL$_1$ in a crystal plate of thickness T is given by OPL$_1$=T/cos($\varphi_B$) where $\varphi_B$ is the internal Brewster angle given by the Snell equation sin($\theta_B$)=n×sin($\varphi_B$). For Ce:YAG crystals, $\varphi_B$=28.2° and OPL$_1$=1.14×T. By including a HR coating at the back of fluorescent body 201 that is reflective at the pump wavelength, the double-pass optical path length is OPL$_2$=2×OPL$_1$=2.28×T. The energy absorption is ABS$_i$=1−exp(−$\mu_\alpha$ OPL$_i$). With $\mu_\alpha$=60 cm$^{-1}$ and T=250 μm, ABS$_2$=0.967. Consequently, the back HR coating at pump wavelength allows an absorption of 96.7% of the pump power in a Ce:YAG crystal of thickness T=250 μm. Implementing fluorescent body 201 with such a thin crystal allows the deposited heat to be transferred more easily to heat spreader 202, while reducing the effect of the relatively low thermal conductivity ($\kappa$=11.2 W/m/K) of the Ce:YAG crystal. Further, reflection of the pump beams at the HR coating prevents the pump beams from degrading the material (e.g., solder or adhesive) used to bond fluorescent body 201 to heat spreader 202, thus increasing the reliability of light source 200. The embodiments of the present disclosure are all illustrated using thin crystals to provide a fluorescent body. However, the shape and size of the fluorescent body 201 may be adapted to the particular design of the light source, and optical arrangements may be designed to capture light emitted not only from a face of fluorescent body 201 that faces collimating lens 210, but from other sides of the fluorescent body 201. Further, fluorescent body 201 may be formed by a rod or ridge-shaped waveguide, with heat collection provided around sides of the waveguide, rather than only at the back of fluorescent body 201 as illustrated.

As mentioned above, heat spreader 202 can be fabricated from a single material or a stack of materials having properly chosen thermal properties, the most important properties of each material being the thermal conductivity $\kappa$ (expressed in W/m/K) and the linear coefficient of thermal expansion a (often expressed in ppm/K). The choice of material(s) aims to favor the cooling of the fluorescent material by using high thermal conductivity materials while avoiding mechanical stresses, and, in particular, warpage (thermally induced curvature) of the fluorescent body 201 and heat spreader 202 assembly from a large mismatch of their respective coefficients of thermal expansion (CTEs). Thus, the heat spreader in some embodiments is implemented using a stack of different materials, such as stacks including very high thermal conductivity plates such as CVD (chemical vapor deposited) diamond plates ($\kappa$>1800 W/m/K). Fluorescent body 201 and heat spreader 202 can be bonded using, for instance: adhesives (optical, thermal, thermally conductive, etc.), soldering techniques, surface contact techniques, bonding techniques (diffusion bonding) or mechanical clamping with or without thermal interface materials (TIMs), such as thermally conductive pastes. Heat spreader 202 can be thermally isolated from the laser diode mount 203, as shown in FIG. 2A, or may be in thermal contact with laser diode mount 203 using a TIM. Heat spreader 202 and the laser diode mount 203 can alternatively be fabricated from a contiguous thermally-conductive material. Heat spreader 202 and/or the laser diode mount 203 can be cooled passively or actively. Passive cooling is achieved by a thermal conductive path between heat spreader 202 and/or laser diode mount 203 in contact with a base 211 of light source 200 (i.e., a bottom plate of the housing of the light source 200) using a TIM 212 such as: a thermally conductive paste, a thermally conductive adhesive, a thermal pad, etc. When active cooling of the heat spreader 202 is employed, a thermoelectric cooler (TEC) 213 is generally located between the heat spreader 202 and base 211 of light source 200. In such an implementation, a separate TIM is included on both sides of TEC 213. In embodiments including TEC 213, it is often necessary to include a temperature probe 214 such as a thermistor thermally coupled to heat spreader 202, preferably near fluorescent body 201. The output of temperature probe 214 is used to control the current supplied to TEC 213 to stabilize the temperature of fluorescent body 201 via a closed feedback control loop. Such thermal control avoids problems such as temperature-induced quenching of the fluorescent effect in, or irreversible damage to, fluorescent body 201 due to local overheating in the pumped volume. Light source 200 is protected from environmental dust and humidity by packaging including base 211, side walls 215, and a top cover 216 with a hermetically sealed AR coated window 217. All electrical connections (e.g.: pump laser diodes, thermistor, and TEC) may be made through a hermetic electrical feedthrough (not shown) on one of the side walls 215. A mechanical connection having high thermal conductivity to the flat surface at the bottom of base 211 is essential to remove heat from light source 200, which is generally achieved by providing an external heat sink to which base 211 is mounted, preferably using a TIM layer to reduce the thermal resistance of the interface. The external heat sink can be cooled, for instance, by natural or forced convection or conduction (e.g.: fans or circulating liquid cooling systems, etc.).

Figure 3:
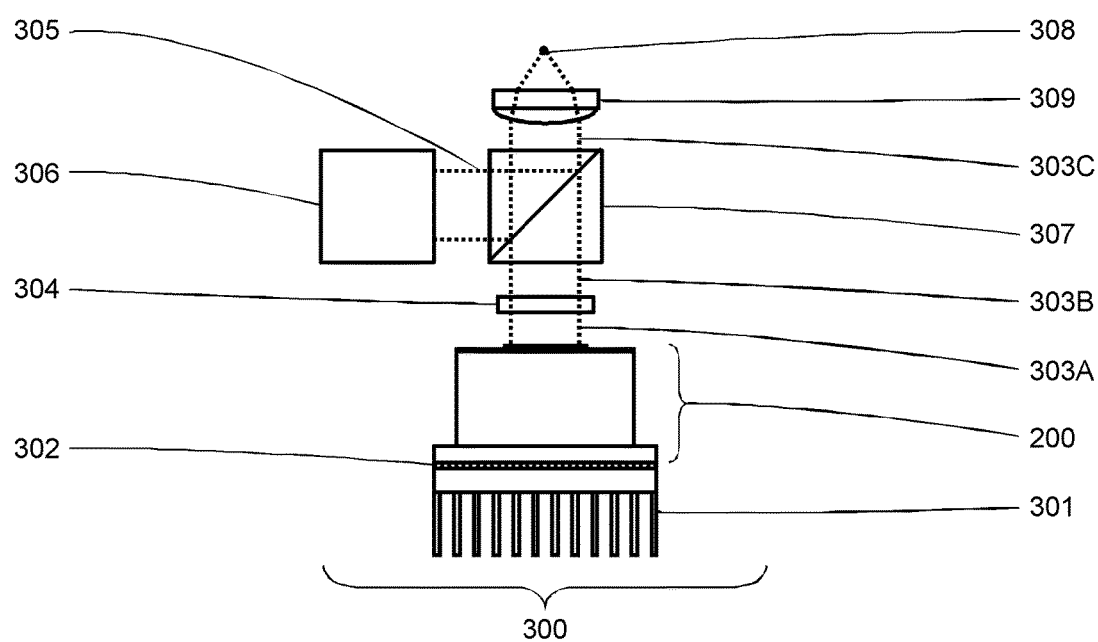
FIG. 3 is a simplified schematic view of the light source of FIGS. 2A-2B.

Referring now to FIG. 3, a simplified schematic of an optical light source 300 is shown in accordance with another embodiment of the disclosure. The disclosed optical light source 300 may be implemented to provide a broader bandwidth or multi-wavelength optical output than the above-illustrated embodiment shown in FIGS. 2A-2B. As described above, light source 200 is mounted to a heat sink 301 using a TIM layer 302. An output collimated fluorescent light beam 303A is filtered with an optical filter 304 such as a bandpass or a colored glass filter. A resulting collimated beam 303B is combined with a collimated beam 305 of a secondary light source 306 such as a laser, an LED or any other light emitting device, such as another fluorescent light source similar to light source 200. A beam combiner 307, such as a dichroic beam combiner cube combines the light from light source 200 and secondary light source 306. Additional secondary light sources and beam combiners (not illustrated) can be added along the path of collimated beam 303B. A final combined collimated beam 303C can be used directly or focused on a spot 308 using a focusing lens 309. In applications requiring fiber coupling, the input tip of an optical fiber (not shown) can be precisely positioned on the focal spot 308 in order to maximize the fiber-coupled output power. Alternatively, in each of the exemplary embodiments disclosed herein, the focusing device, e.g., focusing lens 309 may be provided by a parabolic mirror, a Fresnel lens, or any other refracting, reflecting or diffractive optical element. The focusing device generates an image of the pumped location of fluorescent body 201 at a focal point. The input tip of a light guide, e.g., an optical fiber face, can be made coincident with the image location, i.e., an image plane of the pumped location of fluorescent body 201, in order to couple the output beam of light source 200 to another device/location.

Figure 4:
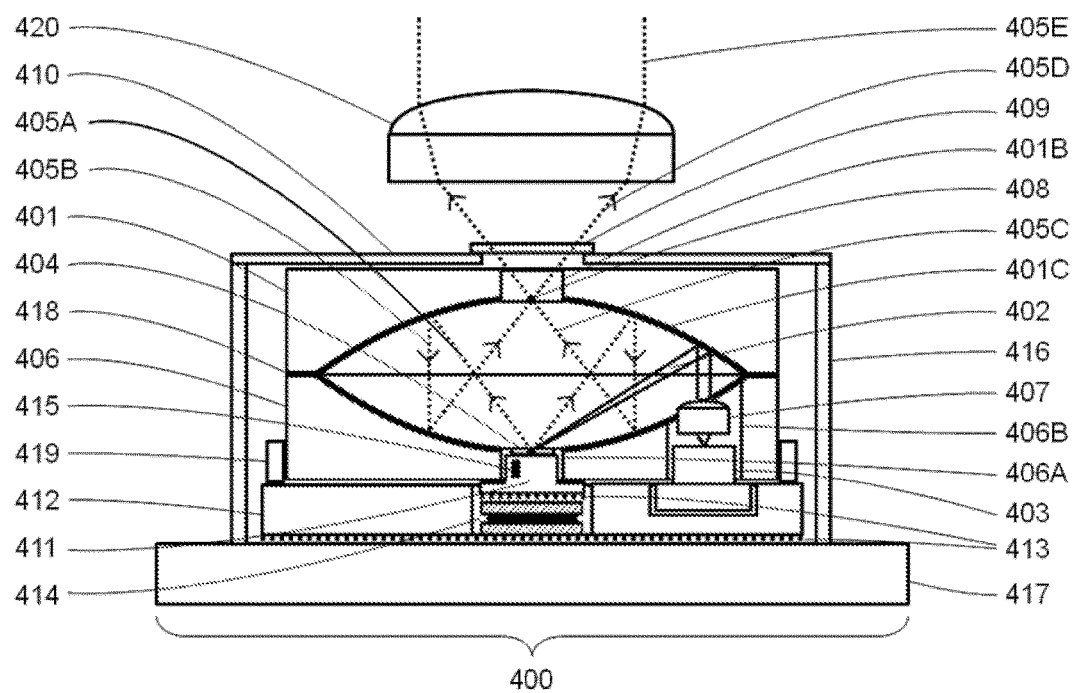
FIG. 4 is a side cross-section view of a light source according to another embodiment of the disclosure.

Referring now to FIG. 4, a light source 400 in accordance with another embodiment of the disclosure is shown. Light source 400 is similar to light source 200, but includes a second (bottom) parabolic mirror 406 that provides for shifting the apparent position of the source, i.e., a fluorescent body 404, to a position near an output window 409 of the package, which enables locating a collimating lens 420 that collects and collimates the output fluorescence light outside the package to produce a collimated light beam 405E. Light source 400 also allows a direct optical fiber coupling at the top cover of the package similar to that described below with reference to the embodiment depicted in FIG. 5. A top parabolic mirror 401 and bottom parabolic mirror 406 are arranged to face each other. Top parabolic mirror 401 serves two purposes. As in light source 200 of FIGS. 2A-2B, top parabolic mirror 401 focuses a pump beam 402 of each pump laser diode 403 onto fluorescent body 404 formed with a fluorescent material. In contrast to light source 200 of FIGS. 2A-2B, top parabolic mirror 401 has a very small central aperture 401B and an optical coating 401C that reflects, in addition to the pump beam wavelength, the entire bandwidth (or the selected sub-band) of the light emitted by the fluorescent body 404. The second purpose of top parabolic mirror 401 is to collimate a divergent fluorescent light beam 405A. A reflected fluorescent light beam 405B is collimated and directed toward bottom parabolic mirror 406. Bottom parabolic mirror 406 has a small aperture 406A provided by a central hole in which the fluorescent body 404 is located. In particular, fluorescent body 404 is located where the summit of the bottom parabolic mirror 406 would be located if small aperture 406A were not present. Small central aperture 401B will generally have a diameter less than 20% of the diameter of the guiding circle, which is not specifically shown in FIG. 4, but is at the midpoint of the circle of pump beams 402 at their incidence on top parabolic mirror 401, as exemplified by guiding circle 204B of FIG. 2B. The diameter of small aperture 406A provided in bottom parabolic mirror 406 is generally equal to the diameter of small central aperture 401B. For example, the diameter of small central aperture 401B and small aperture 406A may be 10% of the diameter of the guiding circle. Bottom parabolic mirror 406 includes additional holes 406B through which each of pump beams 402 is directed. For clarity, only one pump laser diode 403 and a corresponding collimating lens 407 and small aperture 406A are shown. In practice, multiple pump laser diodes 403 are distributed around the central axis of the system in an arrangement similar to that shown in FIG. 2B.

Fluorescent light beam 405B is reflected by the bottom parabolic mirror 406, resulting in a beam 405C focused toward a focal point 408. The pumped volume of fluorescent body 404 is imaged by the bottom parabolic mirror 406 at the focal point 408 of bottom parabolic mirror 406. The image provides a source of an output divergent fluorescent light beam 405D transmitted through an AR coated hermetically sealed output window 409 at a center of a top cover 410 of the hermetic package. As mentioned above, a broadband HR coating behind fluorescent material 404 redirects the backward fluorescence back through fluorescent body 404 to combine in output divergent fluorescent light beam 405A. Fluorescent body 404 is mechanically and thermally coupled to a heat spreader 411 located at the center of a pump laser diode holder 412. The thermal management of the fluorescent material 404 is similar to the operation of heat spreader 201 of FIGS. 2A-2B and TIMs 413, a TEC 414 and a thermistor 415 are provided to control the temperature of heat spreader 411. The hermetic package is completed by side walls 416 and a thermally conductive base 417, which is coupled to a heat sink as in the light source shown in FIG. 3. In light source 400 of FIG. 4, top parabolic mirror 401 and bottom parabolic mirror 406 are secured together using an optical UV-cured adhesive at an interface 418. The resulting dual-mirror assembly is mounted atop pump laser diode holder 412 by a ring metal spacer 419 and suitable adhesive material.

In example light source 400, top parabolic mirror 401 and bottom parabolic mirror 406 have equal focal lengths that image fluorescent body 404 with a magnification M=1 and the focal point of each of parabolic mirrors 401, 406 coincides with the summit of the opposite parabolic mirror. The optical coating of top parabolic mirror 401 has two purposes: to efficiently reflect the high power density pump laser beams (at least in their respective areas) and to efficiently reflect the fluorescence emitted by fluorescent body 404 over a large solid angle and an appropriate optical bandwidth. Bottom parabolic mirror 406 is generally only used for focusing the fluorescent emissions from fluorescent body 404. Consequently, the optical coating on bottom parabolic mirror 406 may be optimized to reflect light only in the bandwidth of the fluorescent emission. Embodiments of light source 400 are not restricted to the depicted construction of the mirror assembly. For example, other embodiments consistent with the operation of light source 400 may include a single bi-convex lens coated on either side with the proper coating on each side to provide top parabolic mirror 401 and bottom parabolic mirror 406.

Figure 5:
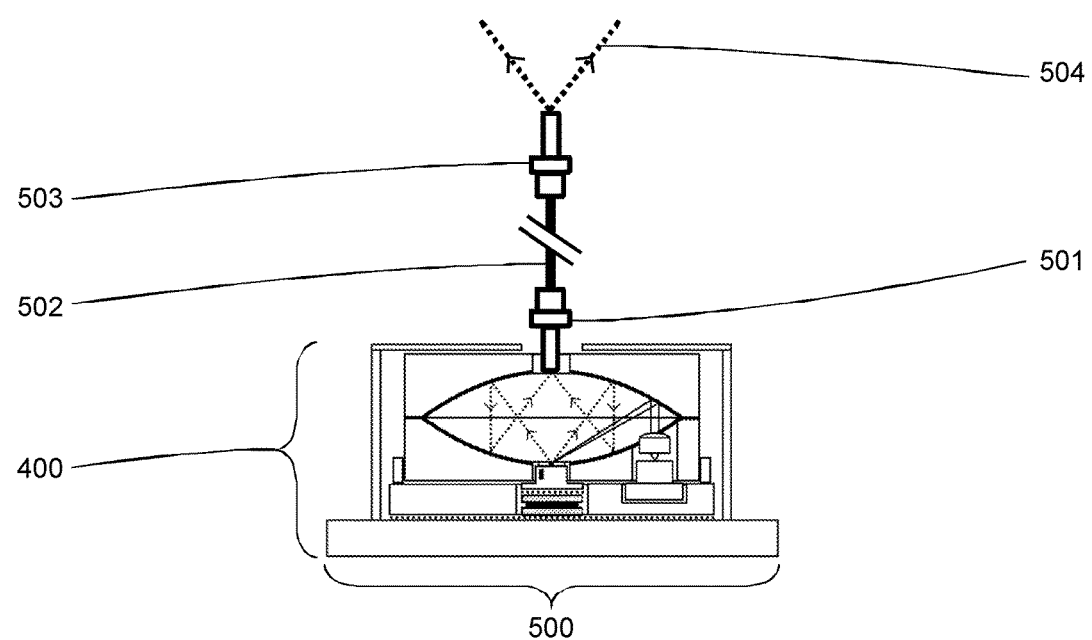
FIG. 5 is a side cross-section view of a light source according to yet another embodiment of the disclosure.

Referring now to FIG. 5, a light source 500 in accordance with another embodiment of the disclosure is shown. The depicted embodiment is similar to light source 400 of FIG. 4 (with the exception of window 409 and collimating lens 420) and is particularly suited for compact optical fiber coupling of the output fluorescent light beam. An input connector 501 tip of an optical fiber 502 is precision-aligned at focal point 408 of bottom parabolic mirror 406 shown in FIG. 4. The fluorescent light beam is then guided into and through optical fiber 502 until the fluorescent light exits an output connector 503 of optical fiber 502 and then freely diverges as an output fluorescent light beam 504.

Figure 6:
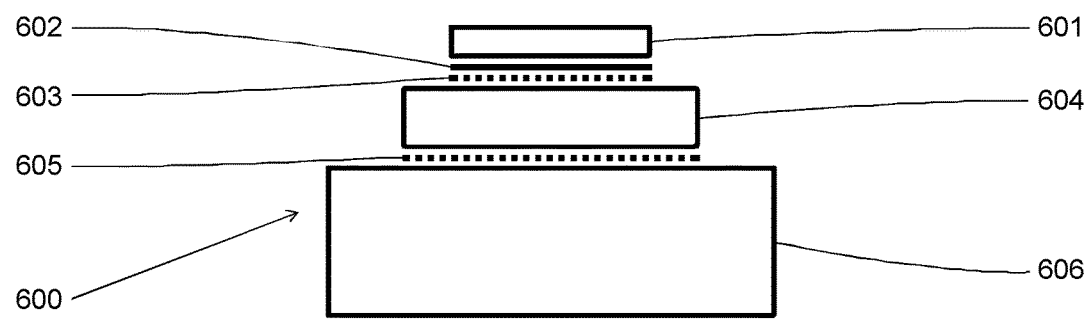
FIG. 6 is a side schematic view of a fluorescent body mounting arrangement according to an embodiment of the disclosure.

Referring now to FIG. 6 a mounting arrangement 600 for a fluorescent body 601 as may be implemented in the above-described light sources is shown. Fluorescent body 601 is back-coated with a high reflectivity (HR) coating 602 on a back face thereof and is bonded to a CVD diamond plate 604 with an adhesive layer 603 having low thermal resistivity. The very high thermal conductivity of diamond plate 604 conducts and laterally spreads heat exiting the hot spot at the center of fluorescent body 601. Diamond plate 604 is glued to a copper heat spreader 606 using an adhesive layer 605 having low thermal resistivity. The dimensions of copper heat spreader 606 may be adapted to match the dimensions of a thermoelectric cooler, such as TEC 213 in FIG. 2. The shape of fluorescent body 601 partially determines the extraction efficiency with respect to the amount of fluorescent light emitted within fluorescent body 601. Since materials used to provide fluorescent body 601 such as Ce:YAG have a large refractive index (n=1.836 at a wavelength of 550 nm), the refraction of the fluorescent light exiting fluorescent body 601 significantly increases the divergence of the output beam provided from fluorescent body 601 and reduces the collection efficiency of the collecting device employed in the light source. For a collecting device of numerical aperture $NA_c$, the corresponding internal numerical aperture is given by $NA_i = \sin^{-1}(\sin(NA_c)/n)$ which is approximately equal to $NA_c/n$ for realistic values of $NA_c$. Therefore the effective solid angle within fluorescent body 601 is significantly reduced by the refraction at the top face of fluorescent body 601. Also, the critical angle within fluorescent body 601 is given by $\theta_c = \sin^{-1}(1/n)$, which is 33° for Ce:YAG. Fluorescent emissions within fluorescent body

601 that have an internal angle of incidence at the surfaces of fluorescent body 601 larger than $\theta_c$ are trapped within the fluorescent body 601.

Figure 7A:
FIGS. 7A-7D are side schematic views of fluorescent body implementations that can be used in the fluorescent body mounting arrangement of FIG. 6.

In order to reduce refraction losses, various implementations of fluorescent body 601 may be used, as illustrated in FIGS. 7A-7D. In a first embodiment as shown in FIG. 7A, the top surface of fluorescent body 601 may be convex-shaped as illustrated by a fluorescent body 601A, which has a trapezoidal cross-section with all four sides inclined (or an inclined perimeter if the fluorescent body has a circular profile) to reduce the internal angle of incidence of the fluorescent emissions, thus reducing the refraction losses. The beveled sides of fluorescent body 601A redirect (via total internal reflection) some of the trapped fluorescent emissions travelling towards the sides of fluorescent body 601A toward high-reflectivity (HR) coating 602 at the back of the body. After reflection by HR coating 602, some of the trapped emissions exit the top face of fluorescent body 601A within the collection angle of the collecting device and contribute to an increased light output.

Figure 7C:
Figure 7B:

Other convex shapes such as illustrated by fluorescent bodies 601B and 601C of FIG. 7B and FIG. 7C, respectively, may alternatively be employed to reduce Fresnel refraction. Fluorescent body 601A and fluorescent body 601B are similar in terms of efficiency, but may differ in manufacturing technique. Another strategy for extracting trapped fluorescent emissions is to provide ground surfaces instead of polished surfaces on faces of fluorescent body 601. By choosing a proper surface roughness, the refraction losses and the trapping of fluorescent emissions by total internal reflection are reduced. However, if the top surface of fluorescent body 601 is ground within the regions in which the pump beams are incident, some scattering of the pump beams will reduce their useful power, making it preferable to avoid ground surfaces in these regions.

Figure 7D:
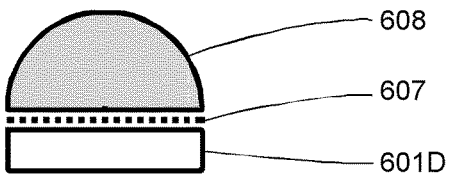

The above-described principles can be alternatively applied as shown in FIG. 7D by providing a half-spherical lens 608 above a plate-shaped fluorescent body 601D using a suitable bonding layer 607. In such an embodiment, it is advantageous to select the material of half-spherical lens 608 to have a coefficient of thermal expansion compatible with that of fluorescent body 601D, although bonding layer 607 will still be subjected to pump beams of high power density and such heating must be accounted for. Alternatively, bonding techniques not requiring a bonding layer, such as optical contacting techniques or mechanical clamping techniques may be used. Even in embodiments including convex surfaces atop fluorescent body 601, the angle of incidence of pump beams in the central top portion of fluorescent body 601 is still substantially equal to the Brewster angle.

While the invention has been particularly shown and described with reference to the preferred embodiment thereof, it will be understood by those skilled in the art that the foregoing and other changes in form, and details may be made therein without departing from the spirit and scope of the invention.

What is claimed:

1. A light source, comprising:
    a body having a material doped to have a fluorescent property when stimulated at a stimulus wavelength, so that the body emits light in an emission band;
    a collimating device for collecting at least a portion of the light emitted by the body over a collection area to generate a collimated output beam;
    a parabolic mirror positioned to have a focal axis directed at the body and having reflective surfaces disposed outside of the collection area so that the collection area is not obstructed by the parabolic mirror; and
    one or more light sources for providing stimulus light at the stimulus wavelength and having an output directed at the parabolic mirror along one or more corresponding optical paths having a direction parallel to the focal axis of the parabolic mirror, so that the parabolic mirror focuses substantially all of the stimulus light provided by the one or more light sources at the body to stimulate emission of the light emitted by the body.

2. The light source of claim 1, wherein the parabolic mirror includes a central aperture passing therethrough for admitting the portion of the light emitted by the body, and wherein the collimating device is positioned at the central aperture of the parabolic mirror to collect the at least a portion of the light emitted by the body.

3. The light source of claim 2, wherein the one or more light sources are multiple light sources positioned in a circular arrangement around the body outside of a projection of the central aperture toward the body.

4. The light source of claim 3, wherein the parabolic mirror is a first parabolic mirror with a small central aperture and wherein the light source further comprises a second parabolic mirror positioned to reflect light emitted from the body that is incident at the first parabolic mirror outside of the aperture and that is directed toward the second parabolic mirror to increase a portion of the light emitted by the fluorescent body that exits the small central aperture of the first parabolic mirror and is collected by the collimating device.

5. The light source of claim 4, wherein the second parabolic mirror focuses an image of the body at an image plane and wherein the light source further comprises an optical waveguide having an input surface positioned at the image plane to receive the image of the body generated by the second parabolic mirror.

6. The light source of claim 4, wherein the first parabolic mirror and the second parabolic mirror extend outward to contact each other, forming a closed cavity except for the aperture through the first parabolic mirror and an additional one or more illumination apertures provided to admit stimulus light from corresponding ones of the one or more light sources.

7. The light source of claim 4, wherein the aperture passing through the first parabolic mirror is a first aperture, wherein the second parabolic mirror includes a second aperture passing therethrough, and wherein the fluorescent body is positioned above or within the second aperture.

8. The light source of claim 1, wherein the one or more light sources and the parabolic mirror are positioned so that the stimulus light is incident on the fluorescent body at an angle substantially equal to the Brewster angle, wherein the one or more light sources emit the stimulus light with a transverse polarization, and wherein the one or more light sources have a rotational alignment such that the stimulus light is p-polarized at incidence on the fluorescent body.

9. The light source of claim 1, wherein the one or more light sources are one or more laser diodes having a junction plane oriented parallel to a plane of reflection of the stimulus light at the parabolic mirror.

10. The light source of claim 1, further comprising a heatsink thermally and mechanically coupled to the fluorescent body for removing heat from the body.

11. The light source of claim 10, further comprising a high thermal conductivity diamond plate, wherein the body is mechanically bonded to a first face of the high thermal conductivity diamond plate at a back of the body opposite a face of the body at which the stimulus light is incident, and wherein a second face of the high thermal conductivity diamond plate is bonded to the heatsink.

12. The light source of claim 10, wherein the one or more light sources are one or more laser diodes, and wherein a substrate of each of the one or more laser diodes are mechanically and thermally bonded to the heatsink.

13. The light source of claim 1, wherein the collimating device is a lens.

14. The light source of claim 1, wherein a face of the body at which the stimulus light is incident has a convex shape to reduce refraction losses at the face of the body.

15. The light source of claim 1, further comprising a lens mounted to a face of the body at which the stimulus light is incident, wherein the lens has a convex shape to reduce refraction losses at the face of the body.

16. The light source of claim 1, wherein one or more faces of the body include ground regions.

17. A light source, comprising:
- a body having a material doped to have a fluorescent property when stimulated at a stimulus wavelength, so that the body emits light in an emission band;
- a collimating device for collecting and collimating at least a portion of the light emitted by the body over a collection area;
- a parabolic mirror positioned to have a focal axis directed at the body and having reflective surfaces disposed outside of the collection area provided by a central aperture through the parabolic mirror so that the collection area is not obstructed by the parabolic mirror;
- multiple laser diodes for providing stimulus light at the stimulus wavelength and positioned in a circular arrangement around the body outside of a projection of the central aperture toward the body, wherein the multiple laser diodes each have an output directed at the parabolic mirror, so that the parabolic mirror focuses substantially all of the stimulus light provided by the multiple laser diodes at the body to stimulate emission of the light emitted by the body, wherein the multiple laser diodes and the parabolic mirror are positioned so that the stimulus light is incident at the parabolic mirror at an angle substantially equal to the Brewster angle, and wherein the one or more laser diodes have junction planes oriented parallel to a plane of reflection of the stimulus light at the parabolic mirror; and
- a heatsink thermally and mechanically coupled to the body for removing heat from the body, and wherein a substrate of each of the one or more laser diodes are mechanically and thermally bonded to the heatsink.

18. The light source of claim 17, wherein the parabolic mirror is a first parabolic mirror with a small central aperture and wherein the light source further comprises a second parabolic mirror positioned to reflect light emitted from the body that is incident at the first parabolic mirror outside of the aperture and that is directed toward the second parabolic mirror to increase the portion of the light emitted by the body that is collected by the collimating device.

19. The light source of claim 18, wherein the first parabolic mirror and the second parabolic mirror extend outward to contact each other to form a cavity except for the aperture through the first parabolic mirror and an additional one or more illumination apertures provided to admit stimulus light from corresponding ones of the multiple laser diodes.

* * * * *